United States Patent [19]
Jain et al.

[11] Patent Number: 6,153,519
[45] Date of Patent: Nov. 28, 2000

[54] METHOD OF FORMING A BARRIER LAYER

[75] Inventors: Ajay Jain; Elizabeth Weitzman, both of Austin, Tex.

[73] Assignee: Motorola, Inc., Schaumburg, Ill.

[21] Appl. No.: 08/829,752

[22] Filed: Mar. 31, 1997

[51] Int. Cl.$^7$ ................................................. H01L 21/44
[52] U.S. Cl. ..................... 438/681; 438/780; 438/781; 438/785; 438/786; 438/789
[58] Field of Search ................................ 438/665, 662, 438/674, 681, 785, 653, 687, 762, 780, 781, 786, 789

[56] References Cited

U.S. PATENT DOCUMENTS

| | | | |
|---|---|---|---|
| 4,490,209 | 12/1984 | Hartman ................................ | 156/643 |
| 4,684,542 | 8/1987 | Jasinski et al. ...................... | 437/245 |
| 4,847,111 | 7/1989 | Chow et al. .......................... | 427/38 |
| 4,977,100 | 12/1990 | Shimura ................................ | 437/44 |
| 5,066,615 | 11/1991 | Brady et al. .......................... | 437/229 |
| 5,200,028 | 4/1993 | Tatsumi ................................ | 156/656 |
| 5,252,518 | 10/1993 | Sanhdu et al. ...................... | 437/200 |
| 5,273,783 | 12/1993 | Wanner ................................ | 427/250 |
| 5,352,623 | 10/1994 | Kamiyama .......................... | 438/398 |
| 5,364,803 | 11/1994 | Lur et al. ............................. | 437/40 |
| 5,559,047 | 9/1996 | Urabe .................................. | 437/41 |
| 5,668,054 | 9/1997 | Sun et al. ............................. | 438/652 |
| 5,675,310 | 10/1997 | Wojnarowski et al. ............. | 338/309 |
| 5,731,220 | 3/1998 | Tsu et al. ............................. | 438/782 |
| 5,913,144 | 6/1999 | Niguyen et al. .................... | 438/643 |

FOREIGN PATENT DOCUMENTS

| | | |
|---|---|---|
| 0 854 505 A2 | 1/1998 | European Pat. Off. . |
| 0 854 505 A3 | 1/1998 | European Pat. Off. . |
| 07180058 | 7/1995 | Japan . |

OTHER PUBLICATIONS

M.H. Tsai et al., "Metal–organic chemical vapor deposition of tantalum nitride barrier layers for ULSI applications", XP 000595265, Thin Solid Films 270(1995) 531–536, pp. 531–536.

Paul Martin Smith et al., "Chemical Vapor Deposition of Ternary Refractory Nitrides for Diffusion Barrier Applications", XP–002123863, Jun. 1996 VMIC Conf. (ISMIC), pp. 162–167.

Shah; "Refractory Metal Gate Processes for VLSI Applications"; IEEE Transactions on Electron Devices, vol. ED–26, No. 4; pp. 631–40 (1979).

Sun, et al.; "Diffusion Barrier Properties of CVED Tantalum Nitride for Aluminum and Copper Interconnections"; VMIC Conf; 1995 ISMIC; pp. 157–62.

Tsai, et al. Metalorganic chemical vapor deposition of tantalum nitrid by tertbutylimidortis (diethylamido) tantalum for advanced metalization; Appl Phys Lett 67 (8); pp. 1128–130; (1995).

Fix, et al.; "Chemical Vapor Deposition of Vandium, Niobium, and Tantalum Nitride Thin Films"; Chem. Mat. vol. 5; pp. 614–619 (1993).

Campbell, et al.; "MOSFET Transistors Fabricated with High Permitivity TiO2 Dielectrics"; IEEE Transactions on Electon Devices; vol. 44, No. 1; pp. 104–09; Jan. 1997.

(List continued on next page.)

*Primary Examiner*—David Nelms
*Assistant Examiner*—Reneé R. Berry
*Attorney, Agent, or Firm*—J. Gustav Larson; George R. Meyer

[57] ABSTRACT

A refractory Metal Nitride and a refractory metal Silicon Nitride layer (64) can be formed using metal organic chemical deposition. More specifically, tantalum nitride (TaN) (64) can be formed by a Chemical Vapor Deposition (CVD) using Ethyltrikis (Diethylamido) Tantalum (ETDET) and ammonia ($NH_3$). By the inclusion of silane ($SiH_4$), tantalum silicon nitride (TaSiN) (64) layer can also be formed. Both of these layers can be formed at wafer temperatures lower than approximately 400° C. with relatively small amounts of carbon (C) within the film. Therefore, the embodiments of the present invention can be used to form tantalum nitride (TaN) or tantalum silicon nitride (TaSiN) (64) that is relatively conformal and has reasonably good diffusion barrier properties.

27 Claims, 3 Drawing Sheets

OTHER PUBLICATIONS

Akasaka et al.; "Low–Resistivity Poly–Metal Gate Electrode Durable for High–Temperature Processing"; IEEE Transactions on Electron Devices; vol. 43, No. 11; pp. 1864–68; (1996).

Hubbard et al., "Thermodynamic Stability of Binary Oxides in Contact with Silicon"; Mat. Res. Soc. Symp. Proc. vol. 401; pp. 33–39 (1996).

He, et al.; "Microstructure and properties of Ti–Si–N films prepared by plasma–enhanced chemical vapor deposition"; Materials Chemistry and Physics; 44; pp. 9–16 (1996).

Sun, et al. "A Comparative Study of CVD Tin and CVD TaN Diffusion Barriers for Copper Interconnection"; IEEE 1995 Int'l Electron Devices Meeting Technical Digest; pp. 461–64 (1995).

Kasai, et al.;"W/WNx/Poly–Si Gate Technology for Future High Speed Deep Submicron CMOS LSIs"; IEDM; pp. 497–500 (1994).

Reid, et al.; Evaluation of amorphous (Mo, Ta, W)–Si–N diffusion barriers for <Si>ICu metallizations; Thin Solid Films, vol. 236; pp. 319–24; (1993).

Wang, et al.; "Diffusion barrier study on TaSix and TaSixNy"; Thin Solid Films,; vol. 235; pp. 169–74 (1993).

Shizhi, et al., "Ti–Si–N Films Prepared by Plasma–Enhanced Chemical Vapor Deposition"; Plasma Chemistry and Plasma Processing; vol. 12, No. 3; pp. 287–97 (1992).

Wright, et al.; "The Effect of Fluorine in Silicon Dioxide Gate Dielectrics"; IEEE Transactions of Electron Devices; vol. 36, No. 5; pp. 879–89 (1989).

Onodera et al.; "A 630–mS/mm GaAs MESFET with Au/WSiN Refractory Metal Gate"; IEEE Electron Device Letters; vol. 9, No. 8; pp. 417–18 (1988).

Chiou, et al.; "Microstructure and Properties of Multilayer–Derived Tungsten Silicide"; Journal of Electronic Materials, vol. 16; No. 4; pp. 251–55 (1987).

METHOD OF FORMING A BARRIER LAYER

FIELD OF THE INVENTION

The present invention relates generally to the processing of semiconductor devices, and more specifically to providing a diffusion barrier onto a semiconductor device.

BACKGROUND OF THE INVENTION

Modern semiconductor devices are requiring speeds in excess of 200 megahertz. In order to form future generations of semiconductor devices, copper (Cu) will essentially be required for interconnects. One problem with the use of copper is that copper cannot directly contact silicon dioxide because copper diffuses too easily through the silicon dioxide layer. Therefore, in the prior art the copper is typically surrounded by a diffusion barrier on all sides.

Diffusion barriers for copper include a number of materials, such as silicon nitride and various refractory metal nitrides (TiN, TaN, WN, MoN) and refractory silicon nitrides (TiSiN, TaSiN, WSiN), or refractory metal-semiconductor-nitride layers. Of all of these barriers, the two showing promise for barriers include tantalum nitride (TaN) and tantalum silicon nitride (TaSiN). These materials are usually deposited by sputtering. However, sputtering generally has poor sidewall step coverage, where step coverage is defined to be the percentage of a layer being deposited on a specific surface divided by the thickness of a layer being deposited on the uppermost surface of a semiconductor device. In the case of sputtered tantalum nitride (TaN) and tantalum silicon nitride (TaSiN), and the step coverage for a 0.35 $\mu$m via can be in the range of 5% to 20% for an aspect ratio of 3:1. Such low step coverage increases the risk that the barrier material will not be thick enough to be an effective diffusion barrier along the sides and bottom of a deep opening. In an attempt to get enough of the material along the walls of openings, a much thicker layer at the uppermost surface is deposited, however, this is undesirable because it increases the resistance of the interconnect.

Chemical vapor deposition (CVD) has been used to form tantalum nitride. The precursors for TaN includes tantalum halides, such as Tantalum Pentachloride (TaCl$_5$). The problem with tantalum halides is that the halides react with the copper causing interconnect corrosion. Another precursor includes penta[dimethylamido]tantalum (Ta(NMe$_2$)$_5$). When this precursor is used to deposit tantalum nitride (TaN), the compound that is actually forms is an insulating layer of Ta$_3$N$_5$. An insulator cannot be used in contact openings or via openings because the insulator prevents electrical contact between the upper interconnect layer and the lower interconnect layer.

Still another known precursor includes terbutylimido-trisdiethyl amino tantalum [(TBTDET), Ta=NBu(NEt$_2$)$_3$]. This compound can be used to form TaN. However, there are problems associated with this precursor. Specifically, deposition temperatures higher than 600° C. is needed to deposit reasonably low resistivity films. Such high temperatures for back-end metallization are incompatible for low-k dielectrics and also induces high stresses due to thermal mismatch between the back-end materials. Another problem with the TBTDET precursor is that too much carbon (C) is incorporated within the layer. This compound generally has approximately 25 atomic percent carbon. The relatively high carbon content makes the layer highly resistive, and results in films that are less dense, lowering the diffusion barrier effectiveness for a comparable thickness of other materials. The resistivity of TaN when deposited using TBTDET at temperatures lower than 600° C. is approximately 12,000 $\mu$ohm-cm. Films with such a high resistivity (desired is less than approximately 1000 $\mu$ohm-cm) cannot be used for making effective interconnect structures.

CVD of titanium silicon nitride (TiSiN) has been demonstrated using titanium tetrachloride (TiCl$_4$). This compound is again undesirable because in forming the TiSiN, chlorine is once again present which causes corrosion of copper and other materials used for interconnect.

A need, therefore, exists to deposit a TaN or TaSiN using organometallic precursors that can be formed relatively conformally with a reasonable resistivity and good barrier properties at lower wafer temperatures.

BRIEF DESCRIPTION OF THE DRAWINGS

The present invention is illustrated by way of example and not limited in the accompanying figures, in which like references indicate similar elements, and in which.

Figure 1:
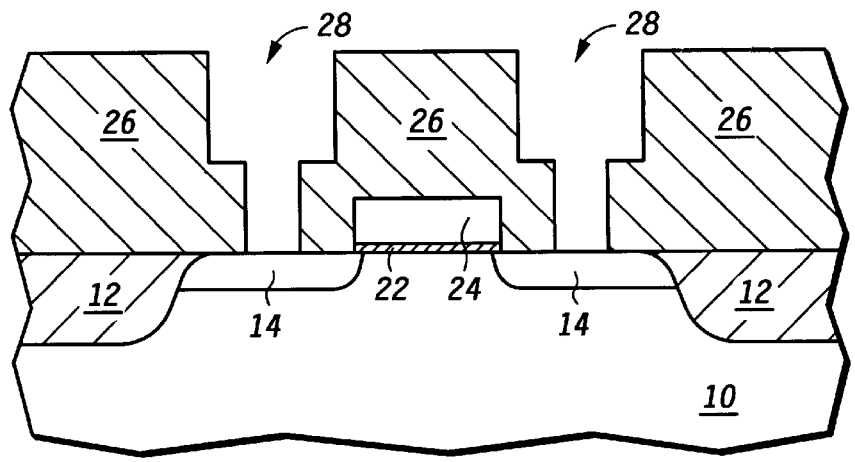
FIG. 1 includes an illustration of a cross-sectional view of a portion of semiconductor device substrate after forming openings in an interlevel dielectric layer to doped regions within the substrate.
Figure 2:
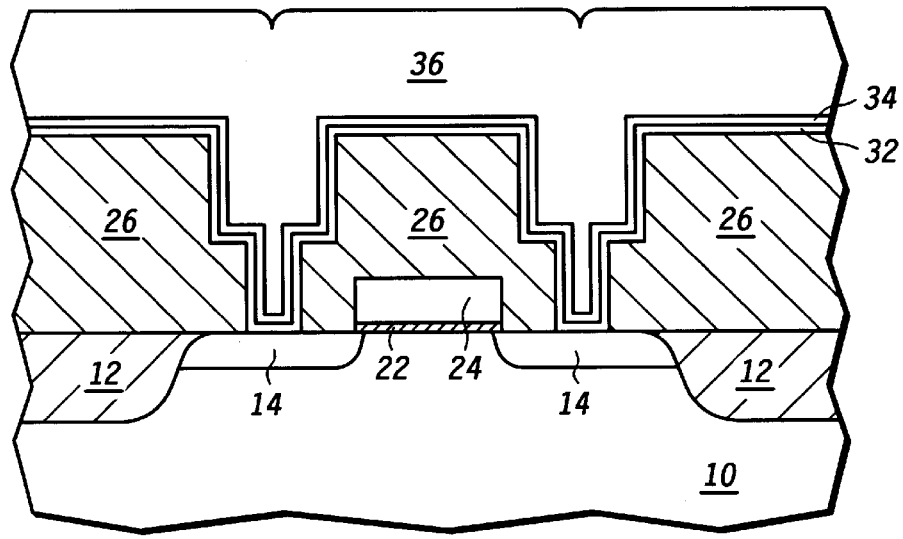
FIG. 2 includes an illustration of a cross-sectional view of FIG. 1 after forming materials needed to form interconnects in accordance with one embodiment of the present invention.

Skilled artisans appreciate that elements in the figures are illustrated for simplicity and clarity, and have not necessarily been drawn to scale. For example, the dimensions of some of the elements in the figures are exaggerated relative to other elements to help to improve understanding of embodiment(s) of the present invention.

DETAILED DESCRIPTION OF THE DRAWINGS

A refractory Metal Nitride and a refractory metal Silicon Nitride layer are formed using metal organic chemical deposition. More specifically, tantalum nitride (TaN) can be formed by a Chemical Vapor Deposition (CVD) using Ethyltrikis (Diethylamido) Tantalum [(ETDET), (Et$_2$N)$_3$Ta=NEt] and ammonia (NH$_3$). By the inclusion of a semiconductor source such as silane (SiH$_4$), a tantalum silicon nitride (TaSiN) layer can also be formed. Both of these layers can be formed at wafer temperatures lower than 500° Celsius with relatively small amounts of carbon (C) within the film. Therefore, the embodiments of the present invention can be used to form tantalum nitride (TaN) or tantalum silicon nitride (TaSiN) layer that is relatively conformal and has reasonably good diffusion barrier properties.

As used in this specification, chemical vapor deposition is one type of deposition method that is to be distinguished from sputter deposition. Sputter deposition is essentially a physical type of deposition in which a layer is being deposited onto a wafer by the action of a plasma directed toward a target. The material evolves from the target and is deposited in a substantially vertically orientation to the wafer. Chemical vapor deposition on the other hand is a chemical reaction that occurs at or near the surface of the substrate to form a layer along the exposed surfaces of the wafer.

Tantalum nitride (TaN) and tantalum silicon nitride (TaSiN) are formed using ETDET/$NH_3$, and ETDET/$NH_3$/ $SiH_4$ respectively. For TaN, the deposition generally takes place in a CVD reactor at a pressure in the range of 5–15 Torr. The monitored deposition temperature varies depending upon where the temperature is being monitored. If the heater block temperature is being monitored, the temperature is generally in a range of approximately 400–480° Celsius. If the wafer temperature is measured, the temperature is typically in a range of approximately 350–400° C.

The ETDET is introduced using Helium (He) as a carrier gas that is bubbled through the ampoule. The flow rate of the Helium (He) is in the range of 200–800 sccm. The heater box temperature for the ampoule is maintained at approximately 80° Celsius. In general, the heater box temperature can be maintained within a range of approximately 50–90° Celsius. The temperature of the ETDET within the ampoule is approximately about 10° Celsius lower than the heater box temperature. Ammonia ($NH_3$) is introduced at a rate ranging from 200–500 sccm which generally gives a deposition rate of approximately 150–200 Å/minute The deposition rate will also depend on the reactor configuration. Using these parameters TaN film can be deposited that has less than 15% carbon (C) and is generally no more than 1%. When used as a barrier layer, the layer TaN is usually deposited to a thickness in a range of approximately 200–300 Å along an exposed surface of the substrate, and generally has step coverage of greater than 50% at the bottom surface of an opening having an aspect ratios of 3:1.

The flow of ammonia has been observed to enhance the deposition across all temperature ranges. Without ammonia limited or no deposition is observed even at high wafer temperatures. This is in contrast to the precursor (TBTDET) used to deposit TaN as reported in literature, which reported deposition without ammonia ($NH_3$).

In CVD systems, there is typically more difficulty depositing the layer at the bottom of the opening, and therefore, the step coverage at the bottom is a good indicator of the thinnest portion of the film. The TaN also has been found to have reasonably good adhesion to the surfaces of both metals and oxides. This is important for integrating the layer into an interconnect process. Should the layer be used to make contact (electrical or physical) to a Silicon containing layer such as a gate electrode or doped regions within a semiconductor substrate, titanium may be deposited between the TaN and Silicon (Si) to form a good ohmic contact. Without the titanium, a relatively high contact resistance between TaN and p+ Silicon may be formed because of large differences in the work functions between p+ silicon and tantalum nitride.

The deposition parameters for TaSiN are the same except as noted below. The pressure is typically in a range of approximately 0.1 to 1 Torr. The flow rates are slightly changed in that: the Helium (He) flows at a rate of approximately 50–150 sccm at the same conditions for the ampoule as described earlier for TaN; ammonia ($NH_3$) is introduced at a rate of approximately 150–300 sccm; and silane ($SiH_4$) is introduced at approximately 1–10 sccm. These parameters give a deposition rate of approximately 150–250 Å/minute with approximately the same carbon incorporation and adhesion characteristics as the TaN.

Different source gases may be used for the Silicon source and the TaN precursor. Specifically, it is possible that Disilane ($Si_2H_6$) or some other Silicon gas could be used. In addition, it is believed that source gasses containing other semiconducotr souces, such as germanium will work as well. However, care should be exercised, in assuring that gas phase reaction is not present. Also, the wafer temperature of the deposition should not exceed 500° Celsius, and be typically less than 400° Celsius, because of the issues noted previously. The TaN precursor has similar concerns. In general, the ethyl group attached to the doubly bonded nitrogen can comprise either an ethyl [$(Et_2N)_3Ta$=NEt] or a methyl [$(Et_2N)_3Ta$=NMe] group. The carrier gas for the ampoule includes helium (He), argon (Ar), nitrogen ($N_2$) or hydrogen ($H_2$).

Following deposition of a TaN films by CVD, the films can be exposed to an in-situ plasma treatment which allowa a reduction in resistivity of the deposited films. Different gases, including argon, hydrogen, nitrogen, silane, and ammonia, individually or in combination can be used for plasma treatment. For example, the use of argon generally allows a reduction in resistivity of the films by a factor of 2 or more. Other gases generally work best in combination with argon although this is not necessary. Use of silane will allow incorporation of Si in the films, thus forming TaSiN in the matrix. This method allows control over the Si to N ratio in the film. The flow rate for the gases can range from 100–1000 sccm; pressure ranging from 100 mTorr–15 Torr; and plasma power ranging from 100–2000 Watts. The plasma treatment can also be done intermittently, that is, deposition/plasma/deposition steps. Further, thermal annealing of films by SiH4 can also be done instead of using plasma in order to incorporate Si in the films. The process involves flowing SiH4 flow over the heated wafers after deposition step. Anneal conditions similar to plasma can be used except that there would be no plasma.

Embodiments of the present invention are better understood with the example that follows in which two levels of interconnects are formed using the chemically vapor deposited material. FIG. 1 includes an illustration of a cross-sectional view of a portion of a semiconductor device substrate 10 before interconnects are formed. The semiconductor device substrate 10 is a monocrystalline semiconductor wafer, a semiconductor-on-insulating wafer, or any other substrate used to form semiconductor devices. Field isolation regions 12 are formed over the semiconductor device substrate 10. Doped regions 14 are source/drain regions for a transistor and lie within the substrate 10 adjacent to the field isolation regions 12. A gate dielectric layer 22 and gate electrode 24 overlie the substrate 10 and portions of the doped regions 14. An interlevel dielectric layer 26 is deposited over the semiconductor device substrate 10. The interlevel dielectric layer 26 can include an undoped, a doped, or combination of doped and undoped silicon dioxide films. In one particular embodiment, an undoped silicon dioxide film is covered by a borophosphosilicate glass (BPSG) layer. After planarization of layer 26, openings 28 are formed through the interlevel dielectric layer 26 and extend to the doped regions 14. As illustrated in FIG. 1, the openings 28 include a contact portion which is relatively narrow that contacts the doped regions 14, and a relatively wider interconnect trench, which is where the interconnect is formed.

In one example of FIG. 1, the contact portion has an aspect ratio is 3:1 as compared to the trench. This is an example of a dual damascene process for forming inlaid interconnects which are generally known within the prior art.

Figure 3:
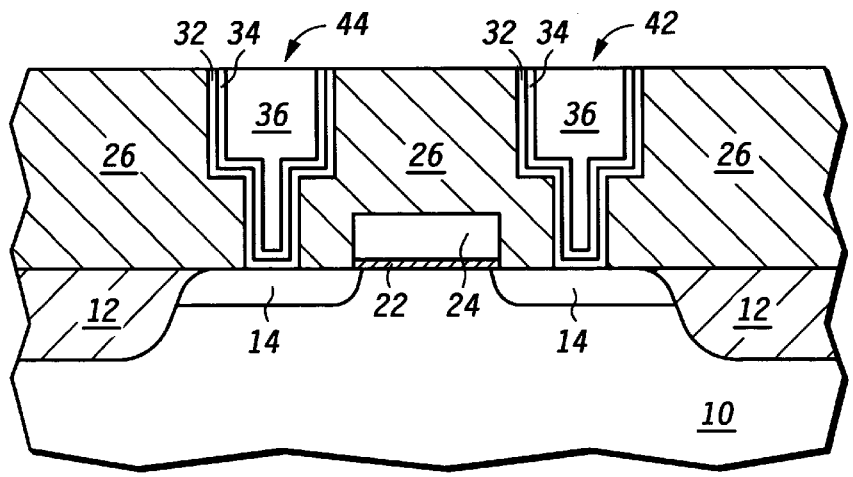
FIG. 3 includes an illustration of a substrate of FIG. 2 after forming inlaid interconnects to doped regions within the substrate.

The materials used to form the contacts and interconnects are then deposited over the interlevel dielectric layer 26 and within the openings 28. As illustrated in FIG. 3, which illustrates a partially completed device, layer 32 of titanium or other refractory material is formed, and is in contact with the doped regions 14. This layer generally has a thickness in a range of approximately 100–400 Å. Next, a TaN or TaSiN layer 34 is formed over layer 32. The tantalum nitride layer 34 or TaSiN layer 34 is formed using the previously described deposition parameters. The thickness of the layer is in the range of approximately 200 to 300 Å. A conductive layer 36 is formed within the remaining portions of the openings and overlying 34. The conductive layer 36 typically includes copper (Cu), aluminum (Al), tungsten (W) or the like. In this particular embodiment, the conductive layer 36 is copper. The partially completed device is then polished to remove the portions of layers 32, 34 and 36 that overlie the interlevel dielectric layer 26. This forms contact portions and interconnect portions for the interconnects 44 and 42 as illustrated in FIG. 3.

Figure 4:
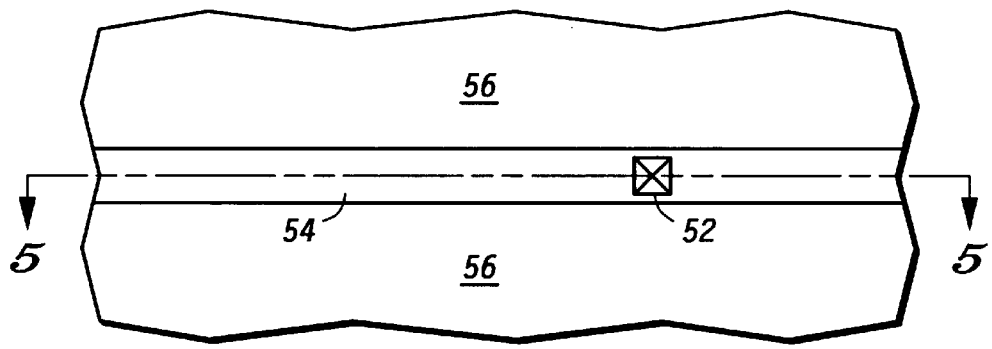
FIG. 4 includes an illustration of a top view of the substrate of FIG. 3. after forming an interlevel dielectric layer and an opening within that layer.
Figure 5:
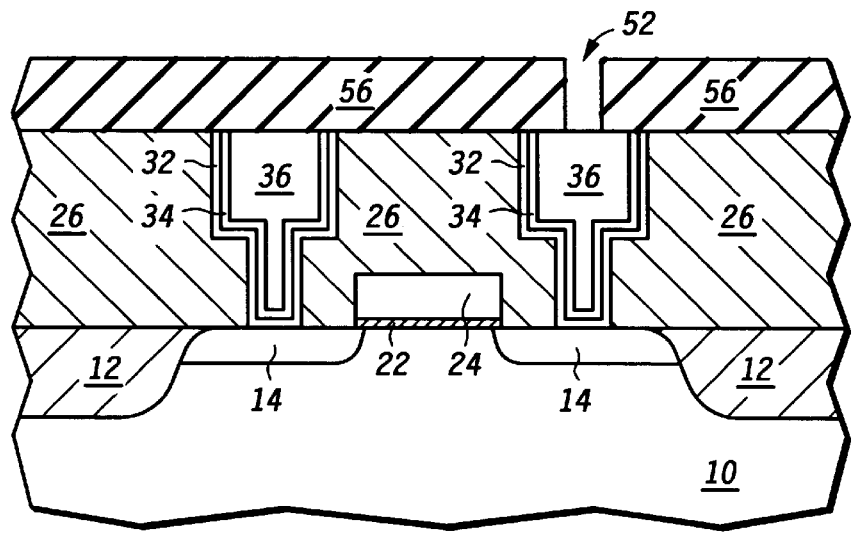
FIG. 5 includes an illustration of a cross-sectional view of the substrate of FIG. 4 illustrating the opening to the lower interconnect.

A second interlevel dielectric layer 56 is deposited and patterned over the interconnects 42 and 44 and the first interlevel dielectric layer 26. FIGS. 4 and 5 illustrate top and cross-sectional views, respectively, of the second interlevel dielectric layer after patterning. The second interlevel dielectric layer 56 includes a doped or undoped oxide. The patterning forms a via opening 52 and an interconnect trench 54. Other via openings and interconnect trenches are formed but are not shown in FIGS. 4 and 5.

Figure 6:
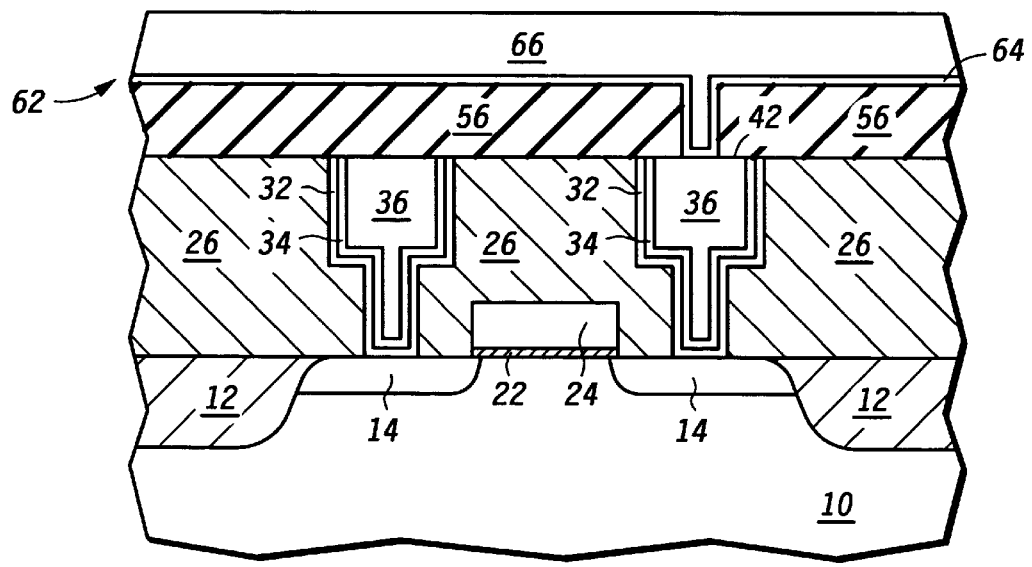
FIG. 6 includes an illustration of a cross-sectional view of the substrate of FIG. 5 after forming an interconnect to a lower interconnect level.
Figure 7:
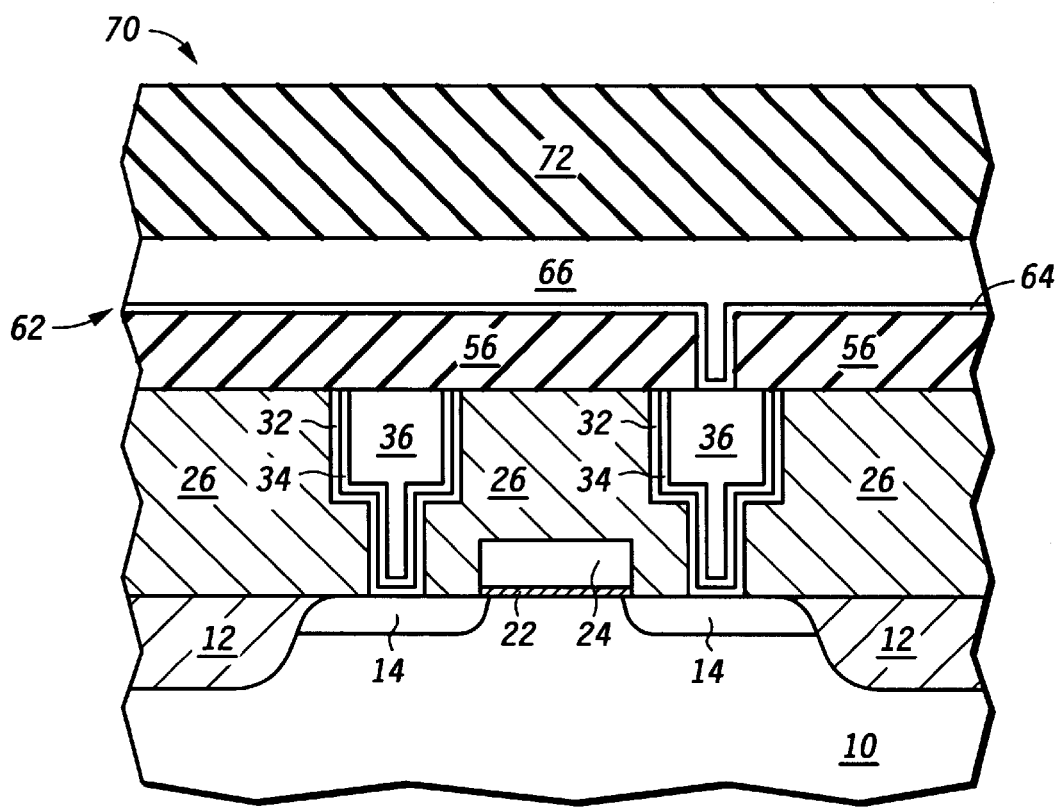
FIG. 7 includes in illustration of a cross-sectional view of the substrate of FIG. 6 after forming a substantially completed device.

As illustrated in FIG. 6, TaN or TaSiN layer 64 is then deposited using one of the previously described deposition techniques. Layer 64 contacts the lower interconnect 42. Layer 64 has a thickness in a range of approximately 200 to 300 Å and is covered by a second conductive layer 66 using a material similar to layer 36. The portions of the layers 64 and 66 overlying the second interlevel dielectric layer outside of the interconnect trench are then removed by polishing to give the structure as illustrated in FIG. 6. The combination of layers 64 and 66 forms a bit line 62 for the semiconductor device. A substantially completed device 70 is formed after depositing a passivation layer 72 overlying the second level interconnects, as illustrated in FIG. 7. In other embodiments, other insulating layers and interconnects levels can be formed but are not shown in the figures.

Many benefits exist for embodiments of the present invention. The CVD reaction that forms TaN or TaSiN is performed at wafer temperatures lower than approximately 500° Celsius, and typically less than 400° Celsius. Therefore, the process is compatible with low-k dielectrics and does not induce high stresses in the films. The amount of carbon incorporation is less than 15 atomic percent, and typically 1 atomic % or less. Therefore, the film does not have porous qualities and is a better diffusion barrier compared to using TBTDET as a precursor. The reduced carbon results in a resistivity of the CVD TaN films that are at least an order of magnitude lower compared to the prior art use of the TBTDET. Still, other advantages with the embodiments is the relative ease of integration into an existing process flow.

Thus it is apparent that there has been provided, in accordance with the invention, a process for depositing a diffusion barrier to fabricate a semiconductor device, which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications as fall within the scope of the appended claims and equivalents thereof.

We claim:

1. A method of forming a barrier layer comprising the steps of:

placing a semiconductor substrate into a chemical vapor deposition (CVD) reactor;

introducing a metal organic precursor into the (CVD) reactor;

introducing a semiconductor source into the (CVD) reactor; and reacting the metal organic precursor, and the semiconductor source to form a refractory metal-semiconductor-nitride layer.

2. The method of claim 1, including an additional step of:

introducing ammonia into the CVD reactor; and wherein the step of reacting includes reacting the ammonia, the metal organic precursor, and the semiconductor source to form a refractory metal-semiconductor-nitride layer.

3. The method of claim 2, wherein the step of introducing the ammonia further comprises the step of introducing the ammonia at a flow rate of approximately 200 to 500 standard cubic centimeter per minute.

4. The method of claim 1, wherein:

the step of introducing the semiconductor source includes the semiconductor source being silane.

5. The method of claim 1 wherein the step of introducing a metal organic precursor includes the metal organic precursor being $[(R^1)_2N)]_3$-Ta=$NR^2$, where $R^1$ comprises an ethyl, and $R^2$ comprises one of an ethyl, a methyl, and hydrogen.

6. The method of claim 5, wherein the step of reacting forms a refractory metal-semiconductor-nitride layer having a carbon content of less than approximately 15 atomic percent.

7. The method of claim 1, wherein:

the step of placing includes placing the semiconductor substrate on a susceptor; and the step of reacting is performed at a substrate temperature of no greater than approximately 400° Celsius.

8. The method of claim 1, wherein the barrier layer is deposited using a plasma.

9. The method of claim 1, wherein the step of introducing a metal organic precursor comprises sub steps of:

flowing a carrier gas into an ampoule at a flow rate of approximately 200 to 800 standard cubic centimeters per minute; and bubbling the carrier gas through the metal organic precursor, wherein the ampoule includes the metal organic precursor and a heater having a temperature of approximately 50° Celsius to approximately 90° Celsius.

10. A method of forming a barrier layer comprising the steps of:

placing a semiconductor substrate into a CVD reactor;

introducing a precursor into the CVD reactor, wherein:

the precursor comprises $((R^1)_2N))_3$-Ta=$NR^2$;

$R^1$ comprises an ethyl; and $R^2$ comprises one of an ethyl, a methyl, and hydrogen;

introducing ammonia into the CVD reactor;

introducing silicon into the CVD reactor; and reacting the precursor, ammonia, and silicon to form a conductive layer containing tantalum silicon nitride.

11. The method of claim 10, wherein the step of reacting further comprises the layer containing tantalum and nitrogen having a step coverage of greater than approximately 50%.

12. The method of claim 11, wherein the step of reacting further comprises the step coverage of greater than 50% occurring in a feature having an aspect ratio of approximately 3:1 or greater.

13. The method of claim 10, wherein the step of reacting further comprises the layer containing tantalum and nitrogen having a carbon content of less than approximately 10 atomic %.

14. The method of claim 10, wherein the step of reacting includes a sub step of:

maintaining a wafer temperature of less than approximately 400° Celsius.

15. The method of claim 14, wherein the barrier layer is deposited using a plasma.

16. The method of claim 10, further comprising the step of:

performing an in-situ plasma treatment after the step of reacting, wherein the in-situ plasma treatment reduces the resistivity of the layer containing tantalum and nitrogen.

17. A method of forming a semiconductor device comprising the steps of:

forming a first insulation layer over a semiconductor device substrate, wherein the first insulation layer has an opening;

forming an interconnect within the opening, wherein the interconnect is formed by:

depositing a first refractory metal-semiconductor-nitride layer using chemical vapor deposition; and forming a first conductive layer after the first refractory metal-semiconductor-nitride layer, wherein the first conductive layer comprises aluminum or copper.

18. The method of claim 17, wherein the step of forming the first conductive layer includes the first conductive layer contacting the refractory metal-semiconductor-nitride layer.

19. The method of claim 17, wherein the step of forming includes the conductive layer forming a physical contact with the refractory metal-semiconductor-nitride layer.

20. The method of claim 19, wherein the step of forming includes the conductive layer forming an electrical contact with the refractory metal-semiconductor-nitride layer.

21. The method of claim 19, further comprising the steps of:

forming a second insulation layer prior to the formation of the first insulation layer, wherein the second insulation layer has an opening;

depositing a refractory metal layer after the step of forming a second insulation layer and prior to the formation of the first insulation layer;

depositing a second refractory metal-semiconductor-nitride layer using chemical vapor deposition after the step of depositing the refractory metal layer and prior to the formation of the first insulation layer; and depositing a second conductive layer after the step of depositing the second refractory metal and prior to the formation of the first insulation layer.

22. The method of claim 21, wherein the step of depositing a refractor metal includes the refractory metal layer comprising a titanium layer.

23. The method of claim 21 wherein the step of forming a second insulation layer includes the opening of the second insulation layer exposing a substrate region.

24. The method of claim 23, wherein the step of forming a second insulation layer includes the substrate region being a silicon substrate region.

25. The method of claim 21 wherein the step of forming a first insulation layer includes the opening of the first insulation layer overlapping the opening of the second insulation layer.

26. The method of claim 1, wherein the barrier layer is part of an interconnect.

27. The method of claim 10, wherein the barrier layer is part of an interconnect.

* * * * *